United States Patent
Ryu et al.

(10) Patent No.: US 8,689,416 B2
(45) Date of Patent: Apr. 8, 2014

(54) METHOD FOR MANUFACTURING SURFACE ACOUSTIC WAVE ELEMENT

(75) Inventors: Yoshiki Ryu, Nagaokakyo (JP); Masashi Omura, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 610 days.

(21) Appl. No.: 12/845,849

(22) Filed: Jul. 29, 2010

(65) Prior Publication Data

US 2011/0035915 A1 Feb. 17, 2011

(30) Foreign Application Priority Data

Aug. 11, 2009 (JP) ................................. 2009-186635

(51) Int. Cl.
*H03H 3/08* (2006.01)
*H01L 41/053* (2006.01)

(52) U.S. Cl.
USPC .............. 29/25.35; 29/594; 29/842; 333/195; 310/334; 310/348

(58) Field of Classification Search
USPC ......... 29/25.35, 842, 846, 594; 333/193, 195; 310/313 B, 313 D, 327, 334, 348; 336/193, 195
See application file for complete search history.

(56) References Cited

U.S. PATENT DOCUMENTS

| 5,998,907 | A | 12/1999 | Taguchi et al. |
| 6,564,439 | B1 * | 5/2003 | Takata et al. .................. 29/25.35 |
| 7,389,570 | B2 * | 6/2008 | Yokota et al. ................. 29/25.35 |
| 2004/0041496 | A1 * | 3/2004 | Imai et al. .................. 310/313 D |
| 2004/0189146 | A1 | 9/2004 | Ueda et al. |

FOREIGN PATENT DOCUMENTS

| JP | 06224678 A | * | 8/1994 | ................... 29/25.35 |
| JP | 9-92895 A | | 4/1997 | |
| JP | 11-55070 A | | 2/1999 | |
| JP | 2002-217666 A | | 8/2002 | |
| JP | 2003-124767 A | | 4/2003 | |
| JP | 2004-297693 A | | 10/2004 | |

* cited by examiner

*Primary Examiner* — A. Dexter Tugbang
(74) *Attorney, Agent, or Firm* — Keating & Bennett, LLP

(57) ABSTRACT

A method for manufacturing a surface acoustic wave element that prevents curvature of a piezoelectric substrate when forming an electrode pattern includes a first step of bonding to a first principal surface of a piezoelectric substrate a support member having a linear expansion coefficient lower than a linear expansion coefficient of the piezoelectric substrate to form a composite substrate, a second step of forming a plurality of grooves in the support member of the composite substrate from a surface that is opposite to a bonding interface between the support member and the piezoelectric substrate, a third step of forming electrode patterns including at least one IDT electrode on a second principal surface of the piezoelectric substrate of the composite substrate, and a fourth step of dividing the composite substrate on which the electrode patterns are formed to form individual surface acoustic wave elements.

6 Claims, 6 Drawing Sheets

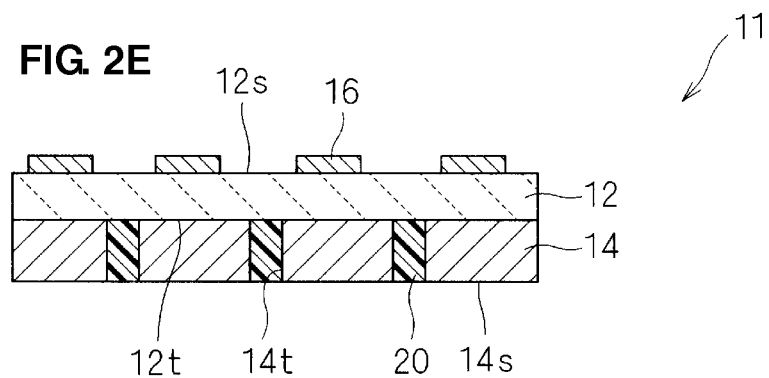
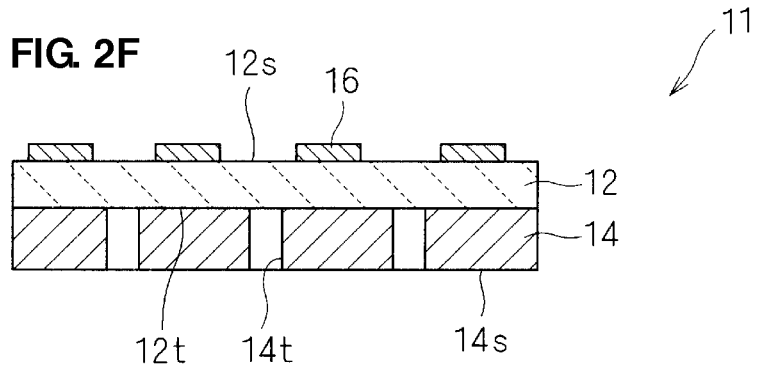
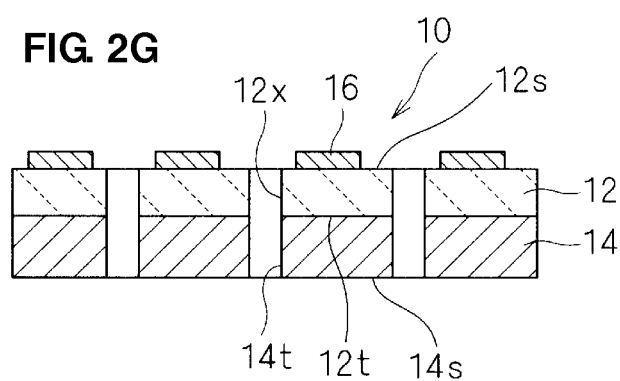

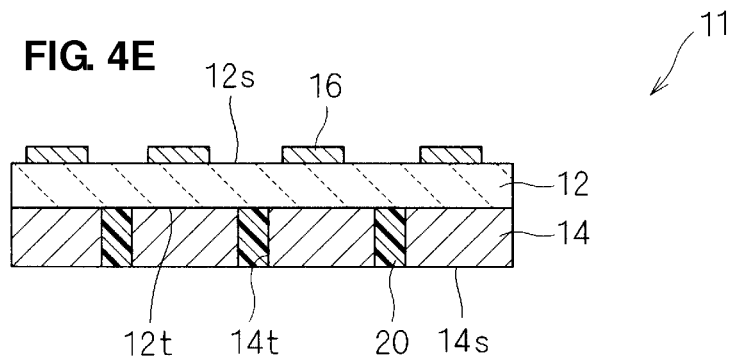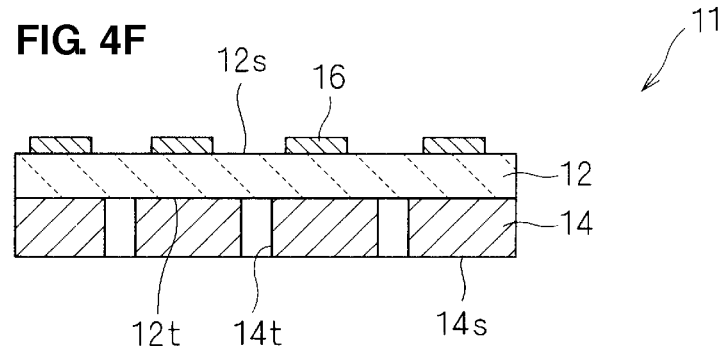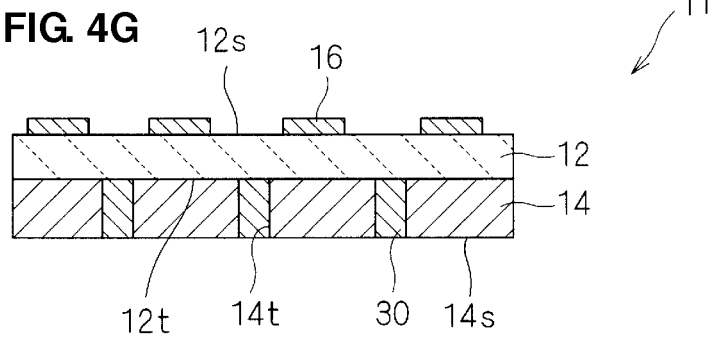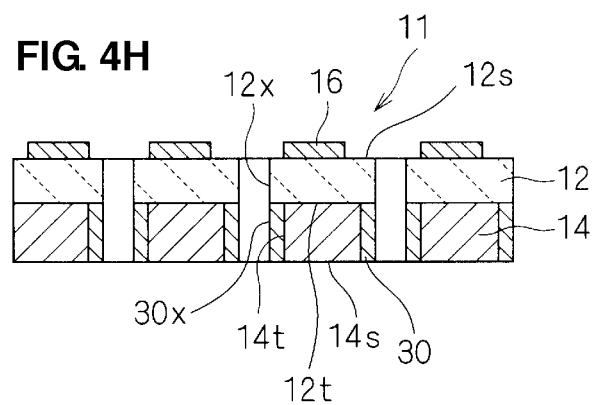

SUBSTRATE CLEANING

BONDING

SLIT FORMATION PROCESSING

HEAT TREATMENT

METHOD FOR MANUFACTURING SURFACE ACOUSTIC WAVE ELEMENT

BACKGROUND OF THE INVENTION

1. Field of the Invention

The present invention relates to a method for manufacturing a surface acoustic wave element, and, more specifically, relates to a method for manufacturing a surface acoustic wave element, such as a filter or a resonator, utilizing surface acoustic waves propagating along a surface of a piezoelectric substrate.

2. Description of the Related Art

Previously, in a small mobile communication system in which the frequency difference between a transmission band and a reception band is small, for example, a surface acoustic wave filter using a piezoelectric substrate having a high electromechanical coupling coefficient, such as lithium tantalate ($LiTaO_3$; LT) or lithium niobate ($LiNbO_3$; LN), has been used in order to secure the attenuation in the reception band. However, since the temperature coefficient of frequency (TCF) of an LT substrate or an LN substrate is high, the interval between the transmission band and the reception band becomes very small considering the manufacturing variation. Therefore, an improvement of temperature characteristics has been desired.

As a measure for improving the temperature characteristics, a structure has been proposed in which a support member having strength and elasticity higher than those of a piezoelectric substrate is bonded to the piezoelectric substrate.

As a method for manufacturing a surface acoustic wave element having such a structure, a structure as shown in the cross sectional view of FIGS. 5A-5C, for example, has been proposed in which a relatively thick piezoelectric substrate 111A and a silicon substrate 112A are bonded to each other, and then each substrate 111A and 112A is cut and ground (cut and removed portions 111C and 112C in FIGS. 5B and 5C) so that a piezoelectric substrate 111B and a silicon substrate 112B that are thinned to a desired thickness are bonded to each other (e.g., Japanese Unexamined Patent Application Publication No. 2004-297693).

Moreover, a method for manufacturing a substrate for a surface acoustic wave element shown in the cross sectional views of FIGS. 6A-6D has been proposed. More specifically, a first substrate 201 and a second substrate 202 that are different in linear expansion coefficient are cleaned as shown in FIG. 6A, and then the first substrate 201 and the second substrate 202 are bonded to each other to form a bonded substrate 206 as shown in FIG. 6B. Then, as shown in FIG. 6C, slits 207 are formed in the side of the first substrate 201 of the bonded substrate 106, the bonded substrate 206 is heated for increasing the bonding strength, and, by a thermal stress caused by the heating treatment, the first substrate 201 is divided along with the slits 207 as shown in FIG. 6D (e.g., Japanese Unexamined Patent Application Publication No. 2002-217666).

In the manufacturing method as shown in FIGS. 5A-5C, electrode patterns, such as an IDT electrode (IDT: interdigital transducers), need to be formed on the surface of the thinned piezoelectric substrate. The piezoelectric substrate and the support substrate are different from each other in the linear expansion coefficient, and the piezoelectric substrate is thinned. Thus, in a process for forming electrode patterns, the piezoelectric substrate is likely to curve in response to temperature changes. When the piezoelectric substrate curves, problems such that the electrode pattern formation accuracy decreases and the piezoelectric substrate itself is damaged are likely to occur.

In the manufacturing method as shown in FIGS. 6A-6D, it is difficult to accurately control the depth, the width, or the angle of the slits, and thus, when heat is applied, damage such as fracture or cracks, is likely to occur in the substrate. Moreover, even when the first substrate can be completely cut, it is difficult to accurately align the patterns in a process for forming the electrode patterns on the surface of the first substrate due to the slits in the surface of the first substrate.

SUMMARY OF THE INVENTION

In view of the above, preferred embodiments of the present invention provide a method for manufacturing a surface acoustic wave element that prevents a piezoelectric substrate from curving when forming electrode patterns.

According to a preferred embodiment of the present invention, a method for manufacturing a surface acoustic wave element includes a first step of bonding to one principal surface of a piezoelectric substrate a support member having a linear expansion coefficient lower than a linear expansion coefficient of the piezoelectric substrate to form a composite substrate, a second step of forming a plurality of grooves in the support member of the composite substrate from a surface opposite to the bonding interface between the support member and the piezoelectric substrate, a third step of forming electrode patterns including at least one IDT electrode on another principal surface of the piezoelectric substrate of the composite substrate, and a fourth step of dividing the composite substrate on which the electrode patterns are formed for forming individual surface acoustic wave elements.

According to the method described above, the grooves can disperse stress concentration to the bonding interface between the piezoelectric substrate and the support member can be dispersed when forming the electrode patterns in the third step. Thus, the occurrence of problems, such as curvature or cracks, of the piezoelectric substrate, can be prevented.

Since the grooves are formed in the side of the support member and there are no irregularities due to the grooves in the other principal surface of the piezoelectric substrate, the electrode patterns can be accurately formed on the other principal surface of the piezoelectric substrate.

Preferably, the grooves are charged with a filler after the second step and before the third step. The filler is removed after the third step and before the fourth step.

In this case, by charging the grooves with a filler to flatten the surface of the support member opposite to the bonding interface between the support member and the piezoelectric substrate, and adsorbing the surface of the support member when forming the electrode patterns in the third step, the curvature of the piezoelectric substrate can be prevented.

Preferably, after the third step and before the fourth step, the grooves are charged with a low expansion coefficient material having a linear expansion coefficient lower than the linear expansion coefficient of the piezoelectric substrate, so that the divided individual composite substrates obtained in the fourth step have the low expansion coefficient material.

In this case, since the individual composite substrates have the low expansion coefficient material, the temperature coefficient of frequency (TCF) can be improved.

According to various preferred embodiments of the present invention, curvature of the piezoelectric substrate when forming electrode patterns can be prevented.

The above and other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 2E-2G are cross sectional views showing the process for manufacturing a surface acoustic wave element according to a preferred embodiment of the present invention.

FIGS. 4E-4H are cross sectional views showing the process for manufacturing a surface acoustic wave element according to a preferred embodiment of the present invention.

DETAILED DESCRIPTION OF THE PREFERRED EMBODIMENTS

Hereinafter, preferred embodiments of the present invention will be described with reference to FIGS. 1A to 4H.

A method for manufacturing a surface acoustic wave element 10 of a first example of a preferred embodiment of the present invention will be described with reference to FIGS. 1A-1D and 2E-2G. FIGS. 1A-1D and 2E-2G are cross sectional views each schematically showing a process for manufacturing a surface acoustic wave element.

As shown in FIG. 2G, in the surface acoustic wave element 10, a support member 14 is bonded to a back surface 12$t$, which is one principal surface of a piezoelectric substrate 12, and electrode patterns 16 each including at least one IDT electrode are disposed on a surface 12$s$ which is the other principal surface of the piezoelectric substrate 12.

The surface acoustic wave element 10 can be produced by the following processes (a) to (g). Hereinafter, each process will be described with reference to FIGS. 1A-1D and 2E-2G.

(a) Substrate Bonding Process

Figure 1A:
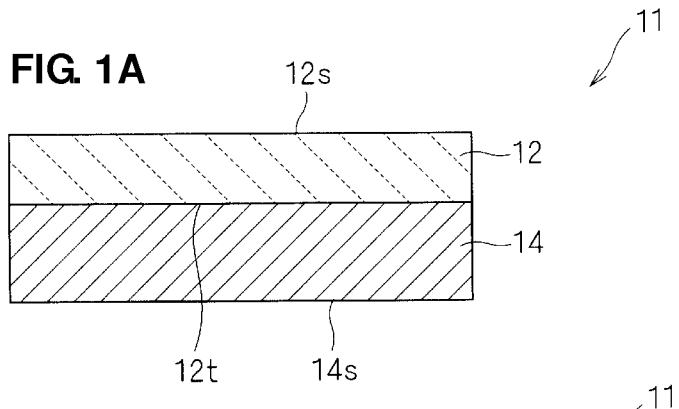
FIGS. 1A-1D are cross sectional views showing a process for manufacturing a surface acoustic wave element according to a preferred embodiment of the present invention.

First, as shown in FIG. 1A, the support member 14 is bonded to the back surface 12$t$ of the piezoelectric substrate 12 to form a composite substrate 11. Materials used for the support member 14 may be materials having a linear expansion coefficient lower than the linear expansion coefficient of the piezoelectric substrate 12. For example, lithium tantalate is preferably used for the piezoelectric substrate 12 and $Al_2O_3$, Si, $SiO_2$, or the like is used for the support member 14. A bonding method is not limited. For example, techniques such as bonding through adhesives or direct bonding by spraying or hydrophobic treatment of the bonding surface, can be applied.

(b) Substrate Thinning Process

Figure 1B:
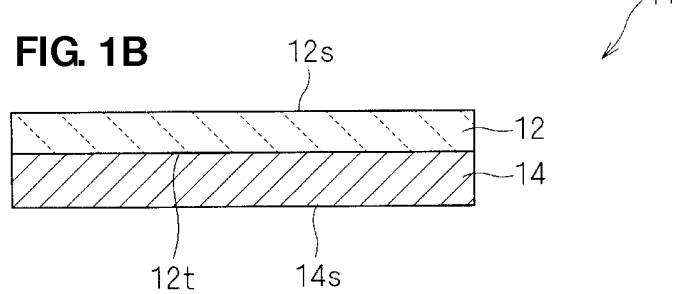

Subsequently, as shown in FIG. 1B, the surface 12$s$ of the piezoelectric substrate 12 and a surface 14$s$ (i.e., the surface 14$s$ opposite to the bonding interface 12$t$ between the piezoelectric substrate 12 and the support member 14) of the support member 14 are cut and ground to adjust the thickness of the piezoelectric substrate 12 and the support member 14 to a desired thickness.

(c) Groove Formation Process

Figure 1C:
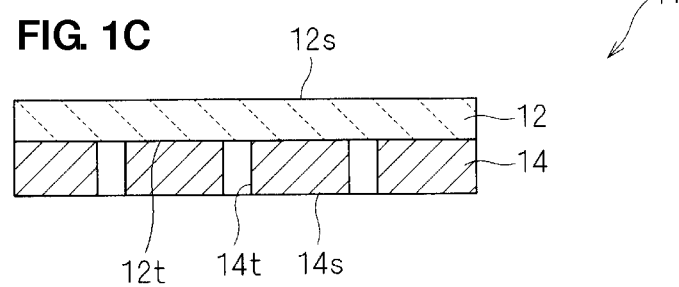

Subsequently, as shown in FIG. 1C, a plurality of grooves 14$t$ are formed in the surface 14$s$ of the support member 14. A method for forming the grooves 14$t$ is not limited. For example, techniques such as cutting with a dicing braid, dry etching, or wet etching, can be applied.

(d) Charging Process

Figure 1D:
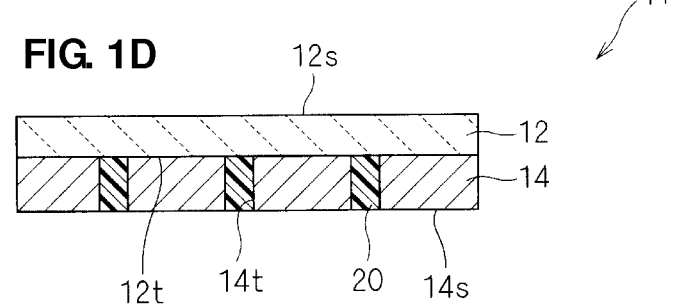

Subsequently, as shown in FIG. 1D, a soft filler 20, such as resin, is embedded in the grooves 14$t$, and then the surface 14$s$ of the support member 14 is flattened. For example, the grooves 14$t$ are charged with the filler 20 using a dispenser. Alternatively, a soft metal material, for example, an aluminum alloy, is deposited in the grooves 14$t$ by sputtering through a mask from the side of the surface 14$s$ of the support member 14. The surface 14$s$ of the support member 14 is flattened for stably adsorbing the support member 14 in the following electrode patterns formation process. Since a soft material is preferably used as the filler 20, the effect of dispersing stress concentration is maintained even when the grooves 14$t$ are formed in the support member 14. In this case, therefore, it is preferable that the Young's modulus of the resin or the metal material is less than that of the support member.

(e) Electrode Pattern Formation Process

Subsequently, as shown in FIG. 2E, electrode patterns 16 each including at least one IDT electrode, for which a material, such as Al or Cu, for example, is used, are formed on the surface 12$s$ of the piezoelectric substrate using a photolithographic technique or an etching technique.

(f) Filler Removing Process

Subsequently, as shown in FIG. 2F, the filler 20 in the grooves 14$t$ is removed from the side of the support member 14 by, for example, using a solvent.

(g) Substrate Dividing Process

Subsequently, as shown in FIG. 2G, grooves 12$x$ are formed in the piezoelectric substrate 12 by dicing processing or the like, and the substrate is divided into surface acoustic wave elements 10.

In the manufacturing method described above, when the electrode patterns 16 each including at least one IDT electrode are formed on the surface 12$s$ of the piezoelectric substrate 12, the stress concentration to the bonding interface 12$t$ between the piezoelectric substrate 12 and the support member 14 is dispersed because the grooves 14$t$ are formed on the support member 14 bonded to the back surface 12$t$ of the piezoelectric substrate 12. Thus, the occurrence of problems of curvature, cracks, and the like of the piezoelectric substrate 12 caused by heat stress when forming the electrode patterns 16 can be prevented.

Since the grooves 14$t$ are formed in the side of the support member 14 and irregularities due to the slits of the grooves 14$t$ are not formed on the surface 12$s$ of the piezoelectric substrate 12, the electrode patterns 16 can be accurately patterned to the surface 12$s$ of the piezoelectric substrate 12.

Since the support member 14 is directly divided by forming the grooves 14$t$ in the support member 14 with a dicing blade or the like, the piezoelectric substrate 12 can be prevented from being damaged when dividing the support member 14.

As shown in FIGS. 1A-1D and 2E-2G, by forming the grooves 14$t$ in so as to correspond to the size of the pieces of the surface acoustic wave element 10 (i.e., the position in agreement with the boundary line of the pieces of the surface acoustic wave element 10) penetrating the support member 14 to reach the bonding interface with the piezoelectric substrate 12 to completely divide the support member 14, processing of the support member 14 when dividing the composite substrate 11 becomes unnecessary to simplify the process, and thus the formation of the grooves 14t described above is preferable.

The grooves can be formed at arbitrary positions from the side of the surface of the support member. The grooves also may be formed to a certain point in the thickness direction of the support member and not penetrating the support member, i.e., not reaching the piezoelectric substrate. In any case, stress concentration can be eased by the grooves, and thus the curvature or the like of the piezoelectric substrate can be prevented.

A method for manufacturing a surface acoustic wave element 10a of a second example according to a preferred embodiment of the present invention will be described with reference to FIGS. 3A-3D and 4E-4H. FIGS. 3A-3D and 4A-4H are cross sectional views each schematically showing a process for manufacturing the surface acoustic wave element 10a.

As shown in FIG. 4H in the surface acoustic wave element 10a of the second example according to a preferred embodiment of the present invention, the electrode patterns 16 each including at least one IDT electrode are formed on the surface 12s of the piezoelectric substrate 12, and the support member 14 is bonded to the back surface 12t of the piezoelectric substrate 12 similarly as in the surface acoustic wave element 10 of the first example according to a preferred embodiment of the present invention.

However, unlike the surface acoustic wave element 10 of the first example according to a preferred embodiment of the present invention, a low linear expansion coefficient material 30, in addition to the support member 14, is bonded to the back surface 12t of the piezoelectric substrate 12. The low linear expansion coefficient material 30 is also bonded to the support member 14.

In the surface acoustic wave element 10a of the second example according to a preferred embodiment of the present invention, the low linear expansion coefficient material 30 having a linear expansion coefficient lower than that of the piezoelectric substrate 12 is bonded to the back surface 12t of the piezoelectric substrate 12, and the contraction of the piezoelectric substrate 12 with the temperature changes is restrained by the low linear expansion coefficient material 30, and thus the temperature characteristics can be further improved compared with the surface acoustic wave element 10 of the first example according to a preferred embodiment of the present invention.

The surface acoustic wave element 10a of the second example according to a preferred embodiment of the present invention can be produced according to the following processes (a) to (h). The processes (a) to (f) are the same as those of the first example according to a preferred embodiment of the present invention. Hereinafter, each process will be described with reference to FIGS. 3A-3D and 4E-4H.

(a) Substrate Bonding Process

Figure 3A:
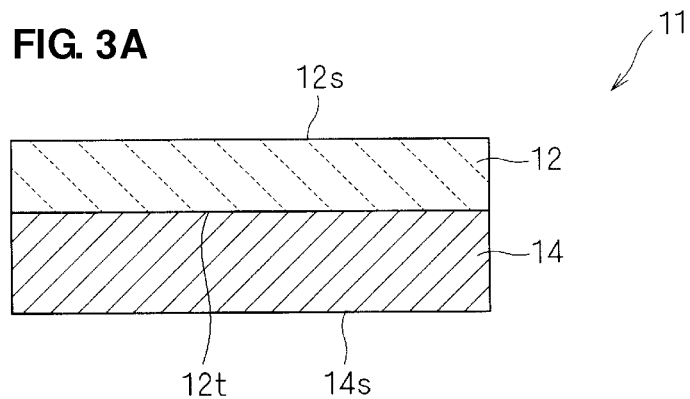
FIGS. 3A-3D are cross sectional views showing a process for manufacturing a surface acoustic wave element according to another preferred embodiment of the present invention.

First, as shown in FIG. 3A, the support member 14 is bonded to the back surface 12t of the piezoelectric substrate 12 to form a composite substrate 11. For the support member 14, materials having a linear expansion coefficient lower than the linear expansion coefficient of the piezoelectric substrate 12 are preferably used. For the support member 14, materials having a linear expansion coefficient lower than the linear expansion coefficient of the piezoelectric substrate 12 are preferably used. For example, lithium tantalate is preferably used for the piezoelectric substrate 12 and $Al_2O_3$, Si, $SiO_2$, or the like is preferably used for the support member 14. A bonding method is not limited. For example, techniques such as bonding through adhesives or direct bonding by spraying or hydrophilizing treatment of the bonding surface, can be applied.

(b) Substrate Thinning Process

Figure 3B:
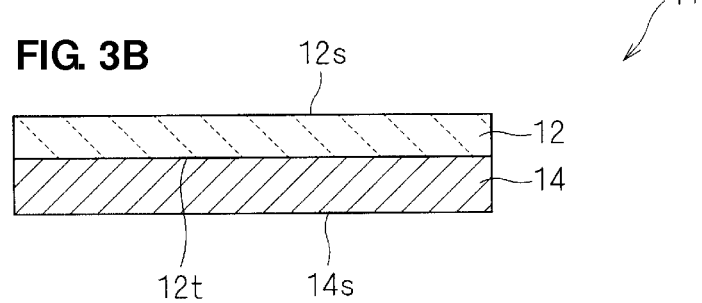

Subsequently, as shown in FIG. 3B, the surface 12s of the piezoelectric substrate 12 and a surface 14s (i.e., the surface 14s opposite to the bonding interface 12t between the piezoelectric substrate 12 and the support member 14) of the support member 14 are cut and ground to adjust the thickness of the piezoelectric substrate 12 and the support member 14 to a desired thickness.

(c) Groove Formation Process

Figure 3C:
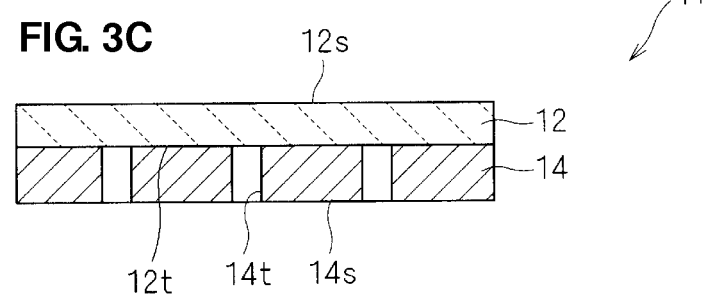

Subsequently, as shown in FIG. 3C, a plurality of grooves are formed in the surface 14s of the support member 14. A method for forming the grooves 14t is not limited.

For example, techniques, such as cutting with a dicing blade, dry etching, or wet etching, can be applied.

(d) Charging Process

Figure 3D:
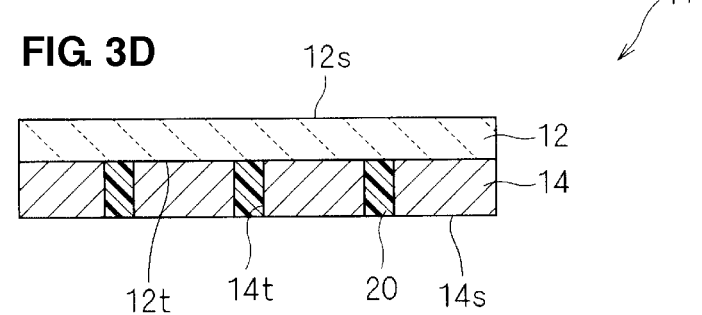
Figure 5A:
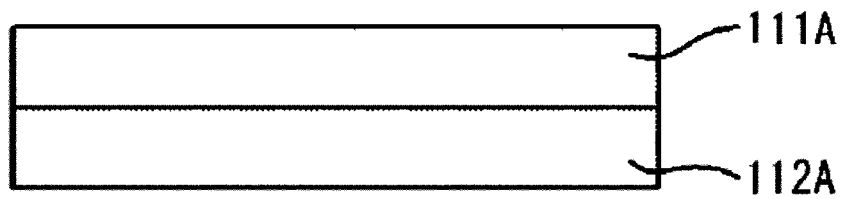
FIGS. 5A-5C are cross sectional views showing a process for manufacturing a surface acoustic wave element according to a conventional example.
Figure 5B:
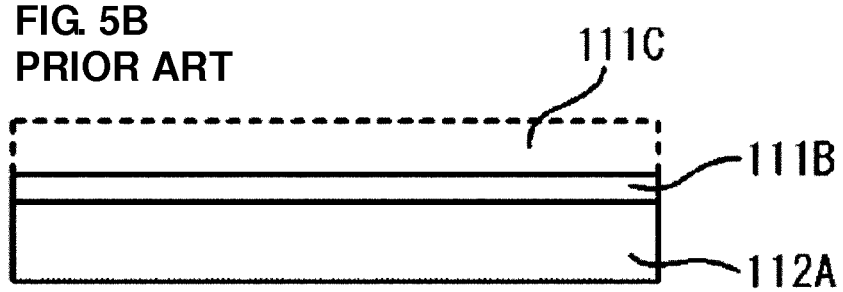
Figure 5C:
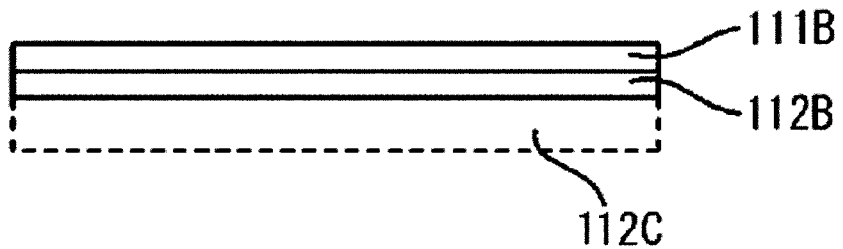
Figure 6A:
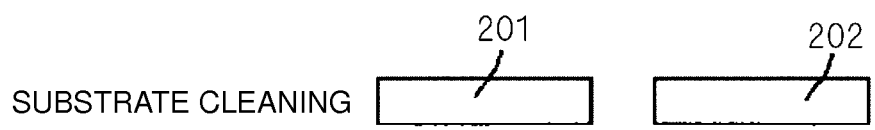
FIGS. 6A-6D are cross sectional views showing a process for manufacturing a surface acoustic wave element according to a conventional example.
Figure 6B:
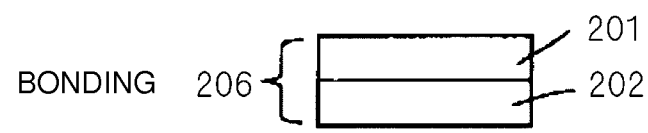
Figure 6C:
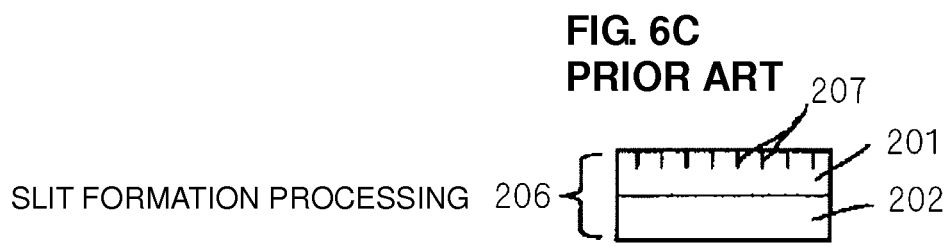
Figure 6D:
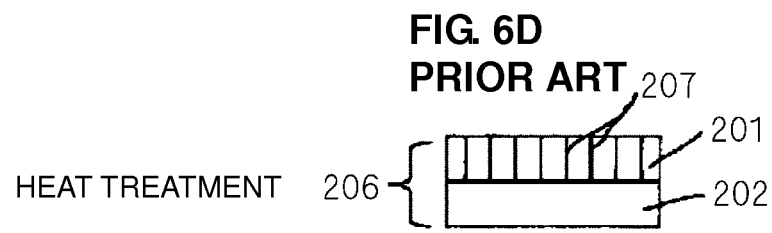

Subsequently, as shown in FIG. 3D, a soft filler 20, such as resin, is embedded in the grooves 14t, and then the side of the surface 14s of the support member 14 is flattened. For example, the grooves 14t are charged with the filler 20 using a dispenser. Alternatively, a soft metal material, for example an aluminum alloy, is deposited in the grooves 14t by sputtering through a mask from the side of the surface 14s of the support member 14. In this case, therefore, it is preferable that the Young's modulus of the resin or the metal material is less than that of the support member.

The surface 14s of the support member 14 is flattened for stably adsorbing the support member 14 in the following electrode pattern formation process. Since a soft material is used as the filler 20, the effect of dispersing stress concentration is maintained even when the grooves 14t are formed in the support member 14.

(e) Electrode Pattern Formation Process

Subsequently, as shown in FIG. 4E, an electrode patterns 16 including at least one IDT electrode is formed on the surface 12s of the piezoelectric substrate 12 using a photolithographic technique or an etching technique.

(f) Filler Removing Process

Subsequently, as shown in FIG. 4F, the filler 20 in the grooves 14t is removed from the side of the support member 14 using a solvent.

(g) Re-Charging Process

Subsequently, as shown in FIG. 4G, the low linear expansion coefficient material 30 having a linear expansion coefficient lower than the linear expansion coefficient of the piezoelectric substrate 12 is charged in the grooves 14t with a dispenser or the like from the side of the surface 14s of the support member 14.

(h) Substrate Dividing Process

Subsequently, as shown in FIG. 4H, the grooves 12x are formed in the piezoelectric substrate 12 by dicing processing or the like, and grooves 30x are formed in the low linear expansion coefficient material 30, and then the substrate is divided into individual surface acoustic wave elements 10a.

In the manufacturing method described above, when the electrode patterns 16 each including at least one IDT electrode are formed on the surface 12s of the piezoelectric substrate 12, the stress concentration to the bonding interface 12t between the piezoelectric substrate 12 and the support member 14 is dispersed because the grooves 14t are formed in the support member 14 bonded to the back surface 12t of the piezoelectric substrate 12. Thus, the occurrence of problems of curvature, cracks, and the like of the piezoelectric substrate 12 caused by heat stress when forming the electrode patterns 16 can be prevented.

Since the grooves 14t are formed in the side of the support member 14 and irregularities due to the slits of the grooves 14t are not formed on the surface 12s of the piezoelectric substrate 12, the electrode patterns 16 can be accurately patterned to the surface 12s of the piezoelectric substrate 12.

Since the support member 14 is directly divided by forming the grooves 14t in the support member 14 with a dicing blade or the like, the piezoelectric substrate 12 can be prevented from being damaged when dividing the support member 14.

As shown in FIGS. 3A-3D and 4E-4H, by forming the grooves 14t so as to correspond to the size of the pieces of the surface acoustic wave element 10 (i.e., the position in agreement with the boundary line of the pieces of the surface acoustic wave element 10) penetrating the support member 14 to reach the bonding interface with the piezoelectric substrate 12 to completely divide the support member 14, the low linear expansion coefficient material 30 is bonded to the back surface 12t of the piezoelectric substrate 12 along with the periphery after dividing and individuating the composite substrate 11. For the low linear expansion coefficient material 30, $Al_2O_3$, $SiO_2$, Si, or the like can be used, for example. In this case, processing of the support member 14 when dividing the composite substrate 11 into individual devices becomes unnecessary to simplify the process, and moreover the contraction of the piezoelectric substrate 12 with temperature changes is effectively restrained by the low linear expansion coefficient material 30 bonded along with the periphery of the back surface 12s of the piezoelectric substrate 12 and the effect of improving the temperature characteristics increases. Thus, the formation of the grooves 14t described above is preferable.

The grooves can be formed at arbitrary positions from the side of the surface of the support member. The grooves also may be formed to a certain point in the thickness direction of the support member and not penetrating the support member, i.e., not reaching the piezoelectric substrate. In any case, stress concentration can be eased by the grooves, and thus the curvature or the like of the piezoelectric substrate can be prevented, and moreover the temperature characteristics can be improved by the low linear expansion coefficient material.

As described above, the formation of a plurality of grooves in the support member bonded to the back surface of the piezoelectric substrate before forming the electrode patterns of the surface acoustic wave element on the surface of the piezoelectric substrate can disperse the stress concentration to the bonding interface between the piezoelectric substrate and the support member caused by temperature changes when forming the electrode patterns of the surface acoustic wave element on the surface of the piezoelectric substrate. Therefore, the occurrence of problems of curvature, cracks, or the like of the piezoelectric substrate in the electrode pattern formation process can be prevented.

The present invention is not limited to the preferred embodiments described above, and can be carried out by changing and/or combining various features and steps of the preferred embodiments described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing a surface acoustic wave element, comprising:
   a first step of bonding to a first principal surface of a piezoelectric substrate, a support member having a linear expansion coefficient lower than a linear expansion coefficient of the piezoelectric substrate to form a composite substrate;
   a second step of forming a plurality of grooves in the support member of the composite substrate from a surface opposite to a bonding interface between the support member and the piezoelectric substrate;
   a third step of forming electrode patterns including at least one IDT electrode on a second principal surface of the piezoelectric substrate of the composite substrate; and
   a fourth step of dividing the composite substrate on which the electrode patterns are formed to form individual surface acoustic wave elements; wherein
   in the second step, the plurality of grooves are formed in the support member so as to be located at boundaries between the individual surface acoustic wave elements at which the individual surface acoustic wave elements are formed by dividing the composite substrate in the fourth step.

2. The method for manufacturing a surface acoustic wave element according to claim 1, further comprising the steps of charging the grooves with a filler after the second step and before the third step, and removing the filler after the third step and before the fourth step.

3. The method for manufacturing a surface acoustic wave element according to claim 1, further comprising the step of, after the third step and before the fourth step, charging the grooves with a low expansion coefficient material having a linear expansion coefficient lower than the linear expansion coefficient of the piezoelectric substrate, so that the divided individual composite substrates obtained in the fourth step have the low expansion coefficient material.

4. A method for manufacturing a surface acoustic wave element, comprising:
   a first step of bonding to a first principal surface of a piezoelectric substrate, a support member having a linear expansion coefficient lower than a linear expansion coefficient of the piezoelectric substrate to form a composite substrate;
   a second step of forming a plurality of grooves in the support member of the composite substrate from a surface opposite to a bonding interface between the support member and the piezoelectric substrate;
   a third step of forming electrode patterns including at least one IDT electrode on a second principal surface of the piezoelectric substrate of the composite substrate; and
   a fourth step of dividing the composite substrate on which the electrode patterns are formed to form individual surface acoustic wave elements;
   the steps of charging the grooves with a filler after the second step and before the third step, and removing the filler after the third step and before the fourth step.

5. A method for manufacturing a surface acoustic wave element according to claim 4, wherein the Young's modulus of the filler is less than the supporting member.

6. A method for manufacturing a surface acoustic wave element according to claim 4, comprising:
   the steps of removing the filler after the third step and before the fourth step, and charging the filler of which the Young's modulus is smaller than the piezoelectric substrate with the grooves.

* * * * *